United States Patent
Ito

(10) Patent No.: US 8,508,985 B2
(45) Date of Patent: Aug. 13, 2013

(54) MAGNETIC MEMORY CELL AND MAGNETIC RANDOM ACCESS MEMORY

(75) Inventor: Kenichi Ito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 311 days.

(21) Appl. No.: 12/994,621

(22) PCT Filed: May 26, 2009

(86) PCT No.: PCT/JP2009/059560
§ 371 (c)(1),
(2), (4) Date: Nov. 24, 2010

(87) PCT Pub. No.: WO2009/145161
PCT Pub. Date: Dec. 3, 2009

(65) Prior Publication Data
US 2011/0222333 A1    Sep. 15, 2011

(30) Foreign Application Priority Data

May 28, 2008 (JP) .................... 2008-140082

(51) Int. Cl.
*G11C 11/00* (2006.01)
(52) U.S. Cl.
USPC .......................................................... 365/158
(58) Field of Classification Search
USPC .......................................................... 365/158
See application file for complete search history.

(56) References Cited

U.S. PATENT DOCUMENTS

| | | | |
|---|---|---|---|
| 5,734,605 A | 3/1998 | Zhu et al. | |
| 6,842,366 B2 * | 1/2005 | Tanizaki et al. | 365/171 |
| 7,313,015 B2 * | 12/2007 | Bessho | 365/158 |
| 7,821,819 B2 * | 10/2010 | Hachino | 365/158 |
| 2006/0092696 A1 | 5/2006 | Bessho | |
| 2007/0297220 A1 | 12/2007 | Yoshikawa et al. | |
| 2008/0037314 A1 | 2/2008 | Ueda | |

FOREIGN PATENT DOCUMENTS

| | | |
|---|---|---|
| JP | 2006128579 | 5/2006 |
| JP | 2008028362 | 2/2008 |
| JP | 2008041217 | 2/2008 |
| WO | WO2005020251 | 3/2005 |

OTHER PUBLICATIONS

Kent et al., "Spin-Transfer-Induced Precessional Magnetization Reversal," Applied Physics letters, 2004, pp. 3897-3899, vol. 84, No. 19.

(Continued)

*Primary Examiner* — Hoai V Ho
*Assistant Examiner* — Tri Hoang
(74) *Attorney, Agent, or Firm* — Antonelli, Terry, Stout & Kraus, LLP.

(57) ABSTRACT

In a magnetic memory which employs applied spin torque magnetization reversal and does not require the switching of the current direction at the time of rewrite, a memory cell includes a stack of a ferromagnetic fixed layer, a nonmagnetic layer, a ferromagnetic recording layer, a nonmagnetic layer, and a ferromagnetic magnetization rotation assist layer. Recording is performed by making the recording layer magnetization direction parallel or antiparallel to the fixed layer magnetization direction. The magnetization directions of the fixed, recording and assist layers are oriented in in-plane directions of the respective magnetic layers, and the magnetization directions of the assist and fixed layers are at 90 degrees. Write current flows from the fixed to the recording layer where the recording layer magnetization direction is rewritten from parallel to antiparallel of the fixed layer magnetization direction and where the recording layer magnetization direction is rewritten from antiparallel to parallel direction.

8 Claims, 9 Drawing Sheets

(56) References Cited

OTHER PUBLICATIONS

Slonczewski, "Current-Driven Excitation of Magnetic Multilayers," Journal of Magnetism and Magnetic Materials, 1996, pp. L1-L7, vol. 159.

Huai et al., "Observation of Spin-Transfer Switching in Deep Submicron-Sized and Low-Resistance Magnetic Tunnel Junctions," Applied Physics Letters, 2004, pp. 3118-3120, vol. 84, No. 16.

Devolder et al., "Magnetization Switching by Spin Torque Using Subnanosecond Current Pulses Assisted by Hard Axis Magnetic Fields," Applied Physics Letters, 2006, pp. 152502-1-152502-3, vol. 88.

Devolder et al., "Distribution of the Magnetization Reversal Duration in Subnanosecond Spin-Transfer Switching," Physical Review B, 2007, pp. 064402-1-064402-5, vol. 75.

\* cited by examiner (a)         (b)

MAGNETIC MEMORY CELL AND MAGNETIC RANDOM ACCESS MEMORY

TECHNICAL FIELD

The present invention relates to a magnetic memory cell and a magnetic random access memory to which spin torque magnetization reversal is applied.

BACKGROUND ART

Recently, attention has been focused on a magnetic random access memory (MRAM) which can possibly replace a conventional dynamic random access memory (DRAM). As described in U.S. Pat. No. 5,734,605, for example, the conventional MRAM employs the following recording method. In a tunnel magnetoresistive effect (TMR) element having a magnetic film/nonmagnetic insulating film/magnetic film multi-layer structure, the magnetization of one of the magnetic films is reversed with a synthetic magnetic field produced by currents flowing through two metal interconnections which are provided respectively above and below the TMR element in directions orthogonal to each other. However, even in the case of the MRAM, when the size of the TMR element is reduced for achieving a larger capacity of the MRAM, the magnitude of the magnetic field required for magnetization reversal is increased, and thus a larger amount of current needs to flow through the metal interconnections. Accordingly, problems of an increase in power consumption and breakage of the interconnections have been pointed out.

As a method of reversing magnetization without using the magnetic field, it has been theoretically shown that the magnetization can be reversed only by causing a certain or larger amount of current to flow through a giant magnetoresistive effect (GMR) film or a tunnel magnetoresistive effect (TMR) film used in a magnetic reproducing head. For example, spin torque magnetization reversal has been demonstrated by using a nano-pillar employing a TMR film, as described in Applied Physics Letters, Vol. 84, pp. 3118-3120 (2004). Having the ability to produce output equal to or more than that producible by the conventional MRAM, the spin torque magnetization reversal using a TMR film has been particularly drawing a lot of attention.

FIG. 1 illustrates a schematic diagram of the spin torque magnetization reversal mentioned above. In FIG. 1, a magnetoresistive effect element and a transistor 6 are connected to a bit line 1. The other end of the transistor is connected to a source line 7. The magnetoresistive effect element includes a first ferromagnetic layer (recording layer) 2 whose magnetization direction varies, an intermediate layer 3, and a second ferromagnetic layer (fixed layer) 4 whose magnetization direction is fixed. The conduction of the transistor 6 is controlled by a gate electrode 5. When the magnetizations of the fixed layer 4 and the recording layer 2 are to be changed from an antiparallel (high resistance) state to a parallel (low resistance) state, a current 8 is caused to flow from the bit line 1 to the source line 7, as shown in part (a) of FIG. 1. In this event, electrons 9 flow from the source line 7 to the bit line 1. On the other hand, when the magnetizations of the fixed layer 4 and the free layer 2 are to be changed from the parallel (low resistance) state to the antiparallel (high resistance) state, the current 8 is caused to flow in a direction from the source line 7 to the bit line 1. In this event, the electrons 9 flow in a direction from the bit line 1 to the source line 7.

Applied Physics Letters, Vol. 84, pp. 3897-3899 (2004) proposes a method of performing the spin torque magnetization reversal by using a magnetization perpendicular to the magnetic film plane without changing the current directions. As shown in FIG. 2, this example uses a magnetoresistive effect element obtained by stacking a fixed layer 21 having a magnetization direction perpendicular to the film plane, a nonmagnetic first intermediate layer 22, a recording layer 23 having a magnetization direction in the film plane, a nonmagnetic second intermediate layer 24, and a reference layer 25 having a magnetization direction in the film plane. For example, when the magnetization of the recording layer 23 is parallel to the magnetization of the reference layer 25, a positive current 26 is first caused to flow to apply spin torque to the magnetization of the recording layer. The time length for which the positive current is caused to flow is a time length corresponding to ¼ of a cycle T of the precession of magnetization induced by the spin torque. The current direction is then switched to an opposite direction 27 to apply torque to stop the magnetization movement. Thus, this example shows that the spin torque magnetization reversal is possible in a time length corresponding to only T/2.

JP 2006-128579A describes using a magnetoresistive effect element as shown in FIG. 3 including a fixed layer 31 having a magnetization in a direction in the film plane, a nonmagnetic layer 32, a free layer (recording layer) 33 having a magnetization in a direction in the film plane, a nonmagnetic layer 34, and a spin torque driving layer 35 having a magnetization perpendicular to the film plane. This document discloses that, only by causing a current 8 to flow, the magnetization direction of the free layer 33 can be reversed to whichever direction, i.e., from a direction parallel to the magnetization direction of the fixed layer 31 to a direction antiparallel thereto, or from the direction antiparallel to the magnetization direction of the fixed layer 31 to the direction parallel thereto. The document also discloses that whether to perform the magnetization reversal is controlled by controlling pulse time.

PRIOR ART DOCUMENT

Patent Documents

Patent Document 1: U.S. Pat. No. 5,734,605
Patent Document 2: JP2006-128579A

Non-Patent Documents

Non-patent Document 1: Journal of Magnetism and Magnetic Materials, 159, L1-6 (1996)
Non-patent Document 2: Applied Physics Letters, Vol. 84, pp. 3118-3120 (2004)
Non-patent Document 3: Applied Physics Letters, Vol. 84, pp. 3897-3899 (2004)

SUMMARY OF THE INVENTION

Problems to be Solved by the Invention

However, the conventional TMR-type MRAM to which spin torque magnetization reversal is applied has the following problem.

In the rewrite of information of a magnetic memory by applying the spin torque magnetization reversal, the current direction for the rewrite from the parallel state to the antiparallel state and the current direction for the rewrite from the antiparallel state to the parallel state need to be opposite to each other, as shown in FIG. 1. This requires an extra circuit such as a switch for switching current directions. Although achieving a faster operation, the case of FIG. 2 also requires a switch for current switching, in particular, a switch which operates extremely fast. Moreover, if the method of rewriting by switching the current directions is employed, a diode cannot be used for element selection. This leads to hampering the reduction of cell area.

Meanwhile, the structure shown in FIG. 3 enables both the rewrite from the parallel state to the antiparallel state and the rewrite from the antiparallel state to the parallel state without changing the current directions. However, since the spin torque driving layer 35 magnetized in a direction perpendicular to the magnetic film plane is located at the uppermost position, there are problems that magnetic anisotropy control of the magnetic film 35 is not easy, and that keeping constant the magnetization directions of the magnetic films is difficult.

An object of the present invention is to provide a magnetic memory cell and a magnetic random access memory which employ applied spin torque magnetization reversal, can be fabricated practically, and do not require the switching of the current directions at the time of rewrite of information.

Means for Solving the Problems

The present invention configures a memory cell in which a fixed layer made of a ferromagnetic material, a nonmagnetic layer, a recording layer made of a ferromagnetic material, a nonmagnetic layer, and a magnetization rotation assist layer made of a ferromagnetic material are stacked one on top of another. The magnetization directions of the fixed layer, the recording layer, and the magnetization rotation assist layer are all oriented in substantially in-plane directions of the respective magnetic layers. The magnetization direction of the magnetization rotation assist layer is at substantially 90 degrees to the magnetization direction of the fixed layer. Further, the magnetization of the fixed layer is fixed with the exchange coupling force from an antiferromagnetic layer provided in contact with a surface of the fixed layer, which is opposite from the recording layer. Furthermore, the magnetization of the magnetization rotation assist layer is fixed with the exchange coupling force from an antiferromagnetic layer provided in contact with a surface of the magnetization rotation assist layer, which is opposite from the recording layer.

Further, a diode element is connected to the magnetic memory cell, the diode element being capable of passing a current in a direction from the fixed layer to the recording layer. Alternatively, a transistor for passing a current is connected to the magnetic memory cell.

In the magnetic memory cell to which the diode is connected, one end of the diode is electrically connected to a source line which is connected to a first write driver circuit, and the magnetization rotation assist layer is connected to a bit line which is connected to a second write driver circuit and an amplifier for amplifying a read signal. In the case where the transistor is connected to the magnetic memory cell, one end of the transistor is electrically connected to the source line which is connected to the first write driver circuit; one end of the magnetization rotation assist layer is connected to the bit line which is connected to the second write driver circuit and the amplifier amplifying the read signal; a word line for controlling the resistance of the transistor is provided, and the word line is connected to a third write driver circuit.

In the magnetic memory cell to which the diode is connected, a current is caused to flow in the direction from the fixed layer to the recording layer in both cases where the magnetization direction of the recording layer is rewritten from a direction parallel to the magnetization direction of the fixed layer to a direction antiparallel thereto and where the magnetization direction of the recording layer is rewritten from the antiparallel direction to the parallel direction.

On the other hand, in the magnetic memory cell to which the transistor is connected, a current is caused to flow in the direction from the fixed layer to the recording layer in both cases where the magnetization direction of the recording layer is rewritten from the direction parallel to the magnetization direction of the fixed layer to the direction antiparallel thereto and where the magnetization direction of the recording layer is rewritten from the antiparallel direction to the parallel direction, as well as a read current is caused to flow in a direction from the recording layer to the fixed layer in a case where information is read from the magnetic memory cell.

A current waveform for writing information to the magnetic memory cell is controlled as follows with respect to time t after a current pulse starts to be applied. Here, $I_0$ denotes a predetermined write current, and T denotes a cycle of a precession of the magnetization of the recording layer.

$$I = I_0 (O \leq t \leq T/4)$$

$$O(T/4 < t \leq 3T/4)$$

$$I_0 (3T/4 < t \leq T5/4)$$

...

$$O(T/4 + (n-1)T < t \leq 3T/4 + (n-1)T)$$

$$I_0 (3T/4 + (n-1)T < t \leq T5/4 + (n-1)T)$$

Effects of the Invention

The present invention can provide a highly-integrated magnetic memory to which spin torque magnetization reversal is applied and does not require the switching of the current directions at the time of rewrite.

MODES FOR CARRYING OUT THE INVENTION

Hereinbelow, the present invention is described in detail by using the drawings.

Figure 4:
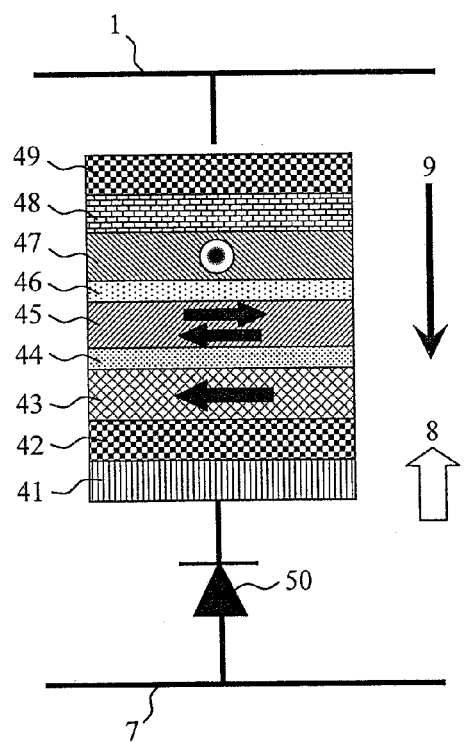
FIG. 4 is a diagram illustrating an example of the configuration of a magnetoresistive effect element used in the present invention.

FIG. 4 shows an example of the principal configuration of a magnetic memory cell using the present invention. A magnetoresistive effect element of the present invention has a structure in which an underlying film 41, an antiferromagnetic film 42, a fixed layer 43, an insulating barrier layer 44, a recording layer 45, a nonmagnetic intermediate layer 46, a magnetization reversal assist layer 47, an antiferromagnetic layer 48, and an appropriate cap layer 49 are stacked one on top of another. The magnetization direction of the fixed layer 43 is fixed to a predetermined direction in the film plane with the exchange coupling force from the antiferromagnetic film 42. The magnetization of the recording layer 45 is parallel to the film plane, and substantially parallel to or antiparallel to the magnetization direction of the fixed layer 43. An insulating layer is usually used as the nonmagnetic intermediate layer 46. The magnetization direction of the magnetization reversal assist layer 47 is parallel to the film plane, and substantially perpendicular to the magnetization direction of the fixed layer 43, and is fixed by the antiferromagnetic layer 48. A diode 50 is used as a switch to turn on/off a current 8 flowing from a source line 7 to a bit line 1 (electrons flow in a direction 9).

Figure 5:
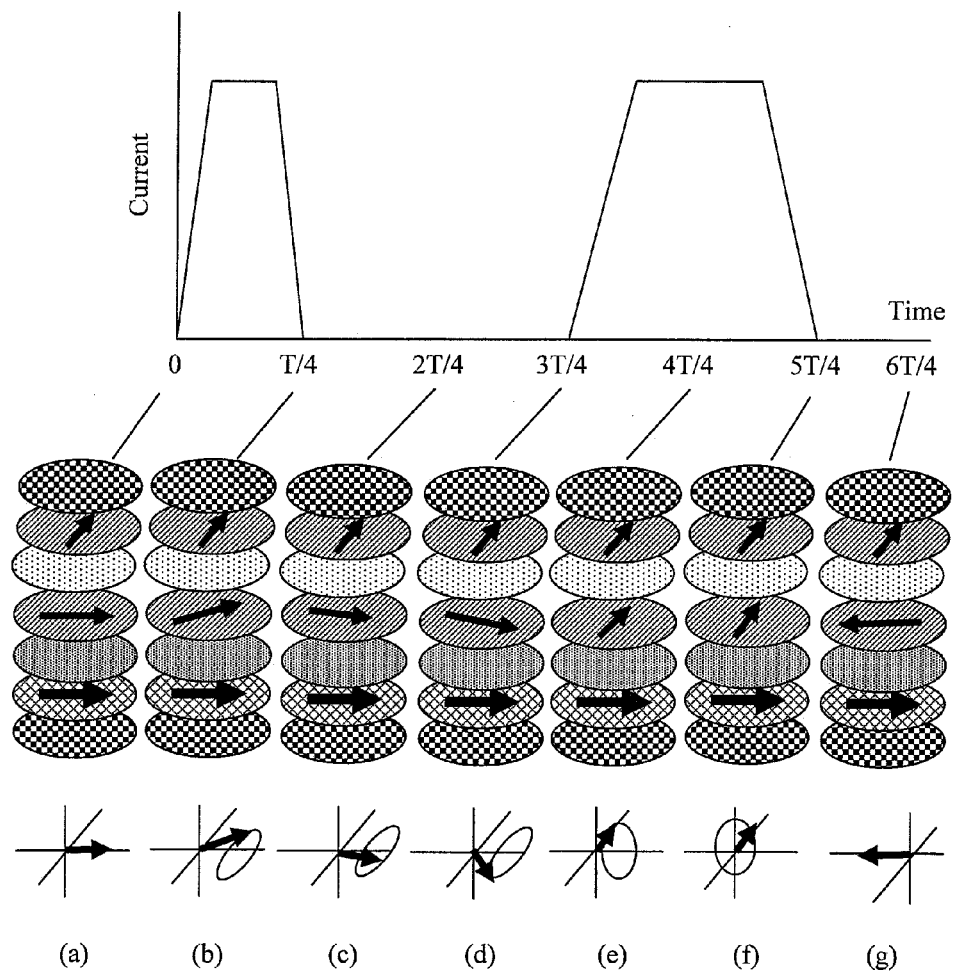
FIG. 5 is a diagram illustrating a method of write from the parallel state to the antiparallel state.

Next, the write operation of the magnetic memory cell is described. FIG. 5 is a diagram showing an example of current value change over time and magnetization direction change of the recording layer along with the current value change, in the case where the magnetization direction of the recording layer 45 is changed from the direction parallel to the magnetization direction of the fixed layer 43 (low resistance state) to the direction antiparallel thereto (high resistance state) in the magnetoresistive effect element shown in FIG. 4. First, a current is increased to a predetermined amount at time zero, is then maintained at the increased current value till time corresponding to ¼ of a cycle T of the precession of the magnetization of the recording layer 45, and is thereafter reduced to zero. The precession of the magnetization of the recording layer is excited, as shown in part (b) of FIG. 5, by the spin torque given to the magnetization of the recording layer from this current. As shown in parts (c) and (d) of FIG. 5, the precession continues while the current is off, i.e., from time T/4 to 3T/4 as well. At time 3T/4, the current is again increased to the predetermined value, and is maintained at the constant value till time 5T/4. During this period, the spin torque again acts on the magnetization of the recording layer from this current, and the precession of the magnetization of the recording layer is amplified as shown in parts (e) and (f) of FIG. 5. After the current is turned off, as shown in part (g) of FIG. 5, the magnetization is switched to a direction opposite to that of the initial state, and the precession is stopped.

Figure 6:
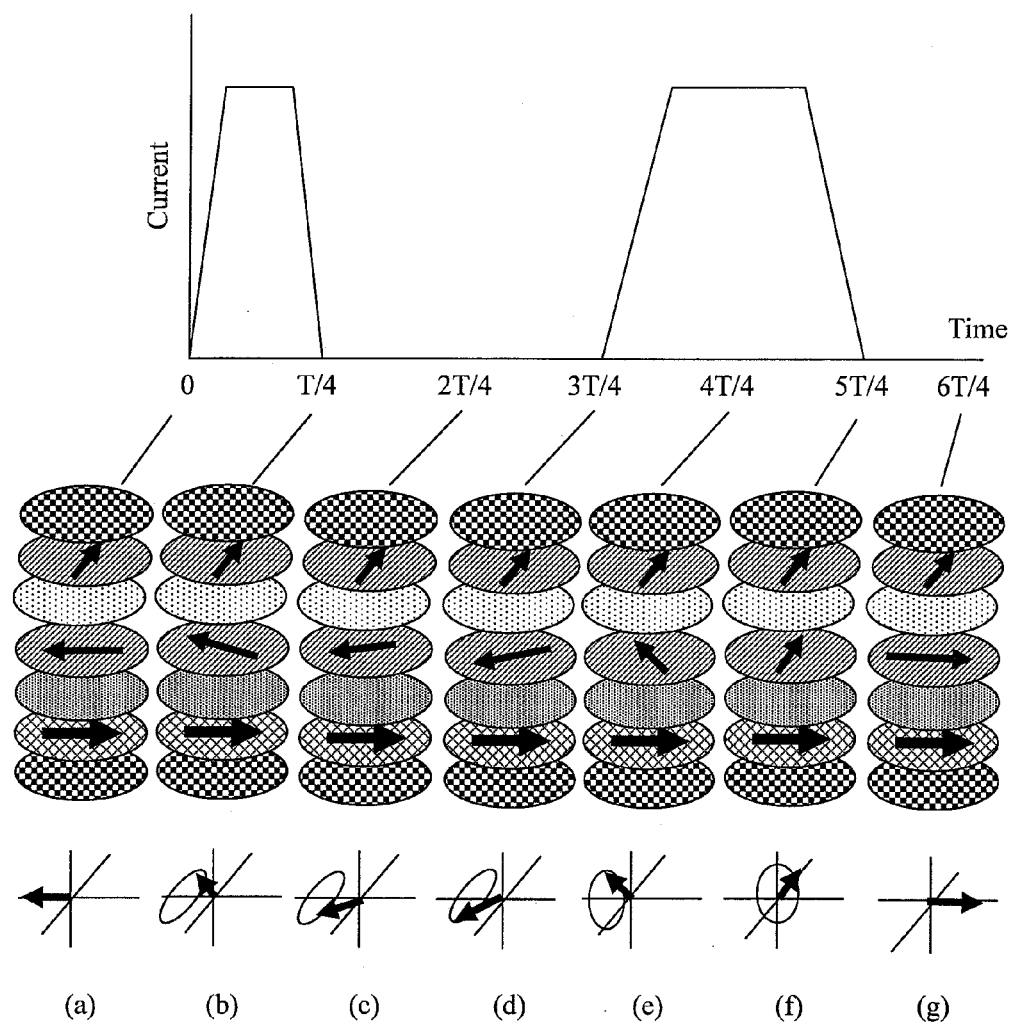
FIG. 6 is a diagram illustrating a method of write from the antiparallel state to the parallel state.

FIG. 6 is a diagram showing an example of current value change over time and magnetization direction change of the recording layer along with the current value change in the case where the magnetization direction of the recording layer 45 is changed from the direction antiparallel to the magnetization direction of the fixed layer 43 (high resistance state) to the direction parallel thereto (low resistance state) in the magnetoresistive effect element shown in FIG. 4. In this case, also, like in the case of FIG. 5, a current is first increased to a predetermined amount at time zero, is then maintained at the increased current value till time corresponding to ¼ of the cycle T of the precession of the magnetization of the recording layer, and is thereafter reduced to zero. The precession of the magnetization of the recording layer is excited, as shown in part (b) of FIG. 6, by the spin torque given to the magnetization of the recording layer from this current. As shown in parts (c) and (d) of FIG. 6, the precession thereafter continues while the current is off, i.e., from time T/4 to 3T/4. At time 3T/4, the current is again increased to the predetermined value, and is maintained at the constant value till time 5T/4. During this period, the spin torque again acts on the magnetization of the recording layer from this current, and the precession of the magnetization of the recording layer is amplified as shown in parts (e) and (f) of FIG. 6. After the current is turned off, as shown in part (g) of FIG. 6, the magnetization is switched to a direction opposite to that of the initial state, and the precession is stopped.

It should be noted that, in FIGS. 5 and 6, the directions of magnetization rotation of the recording layer by the precession are opposite to each other. Specifically, when the direction of a current is oriented in a direction indicated by the arrow 8 of FIG. 4, that is, when the direction of electrons is oriented in a direction indicated by the arrow 9 of FIG. 4, the spin torque, which acts on the magnetization of the recording layer 45 from the spin of the electrons of the flowing current, works in such a direction that makes the magnetization direction of the recording layer 45 coincide with the magnetization direction of the magnetization rotation assist layer 47 between time zero to time T/4. This brings about the excitation of the precession as shown in part (b) of FIG. 5 and part (b) of FIG. 6. If the current is kept flowing without being turned off even after time T/4, however, the spin torque works in the direction that makes the magnetization direction of the recording layer 45 coincide with that of the magnetization rotation assist layer 47, that is, in such a direction that damps the precession, between time T/4 and time 3T/4 in both FIG. 5 and FIG. 6, resulting in the waste of the current. To avoid this, the current is shut off during this time period. When the current is turned on at time 3T/4 again, the spin torque works in such a direction that excites the precession of the magnetization of the recording layer till time 5T/4, consequently completing the magnetization reversal of the recording layer by the spin torque. In this way, the same current direction and waveform of current pulse on the time axis can be used in both cases where the magnetization direction of the recording layer 45 is changed from the direction parallel to the magnetization direction of the fixed layer 43 (low resistance state) to the direction antiparallel thereto (high resistance state) and where the magnetization direction of the recording layer 45 is changed from the direction antiparallel to the magnetization direction of the fixed layer 43 (high resistance state) to the direction parallel thereto (low resistance state). This is the first feature of the present invention.

Next, the second feature of the present invention is described. For example, as described in Applied Physics Letters, Vol. 88, p. 152505 (2006) the magnetization reversal induced by spin torque is demonstrated in that:

(1) the write current rapidly increases with decrease in pulse width in a region where the pulse width is 10 ns or smaller; and (2) the magnetization reversal occurs at random, causing a spread in the distribution of switching times.

The above (1) is not desirable in terms of the increase in power consumption, and (2) is not desirable in terms of the hampering of a stable write operation of a memory. In the region where the pulse width is 10 ns or smaller, a current I required for write is expressed by the following formulae:

$$I = I_{c0} + I_{c0} \ln(\pi/2\theta)(\alpha\gamma H_{eff})^{-1}/\tau_p \qquad (1)$$

$$I_{c0} \propto \sin\theta[p/2/(1+p^2\cos\theta)]-1 \qquad (2)$$

where $\alpha$ denotes a damping constant of the magnetic film of the recording layer; $\gamma$ denotes a magnetic rotation ratio; $H_{eff}$ denotes an effective magnetic field acting on the recording layer 45; $\tau_p$ denotes a current pulse width; p demotes the spin-polarization ratio of the magnetic film of each of the recording layer and the magnetization rotation assist layer; and $\theta$ denotes the angle between the magnetization of the recording layer and that of the magnetization rotation assist layer before the application of a pulse current. $I_{c0}$ expressed by the formula (2) represents an intrinsic threshold current value determined depending on the material and shape of the magnetic films of the recording layer and the magnetization rotation assist layer, i.e., a threshold current value employed when a DC current is used. In this example, since $\theta$ is approximately 90 degrees, the intrinsic threshold current value $I_{c0}$ can be minimized with the formula (2) in each of the elements of the same material or structure. In the formula (1) also, the second term of the formula (1) can be made smaller since $\theta$ is approximately 90 degrees. This brings about an effect of greatly relieving the problem of (1) mentioned above.

Figure 7:
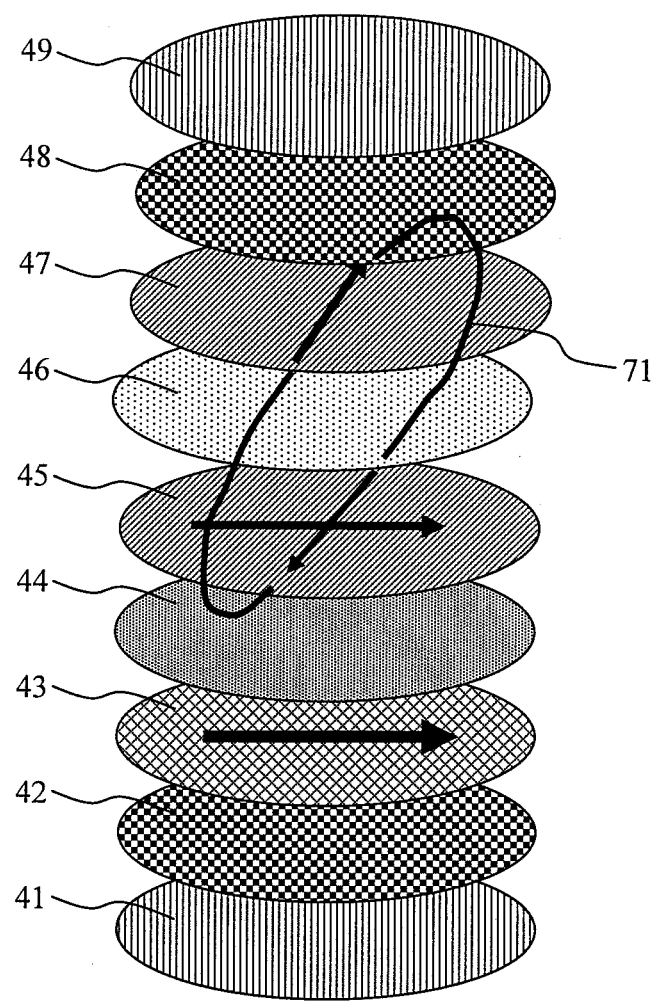
FIG. 7 is a diagram illustrating a leakage magnetic field from a magnetization rotation assist layer of the magnetoresistive effect element of the present invention.

Moreover, according to the present invention, since the magnetization of the magnetization rotation assist layer 47 is oriented in a direction perpendicular to the magnetization of the recording layer 45, a leakage magnetic field 71 produced from the magnetization rotation assist layer 47 is oriented in a direction substantially perpendicular to the magnetization direction of the recording layer 45, as shown in FIG. 7. As is well known, in a magnetic memory such as one of the present invention, an energetically-stable magnetization direction of the recording layer 45 shown in FIG. 4 is called an axis of easy magnetization. On the other hand, a direction perpendicular to this direction is called an axis of hard magnetization. The application of a magnetic field in the hard magnetization axis direction of the recording layer as in this example makes it possible to greatly reduce the spread in the switching probability distribution, as described in Physical Review B, Vol. 75, p. 064402 (2007), for example. This shows that the present invention has an effect of solving the above problems (1) and (2) at the same time.

Figure 8:
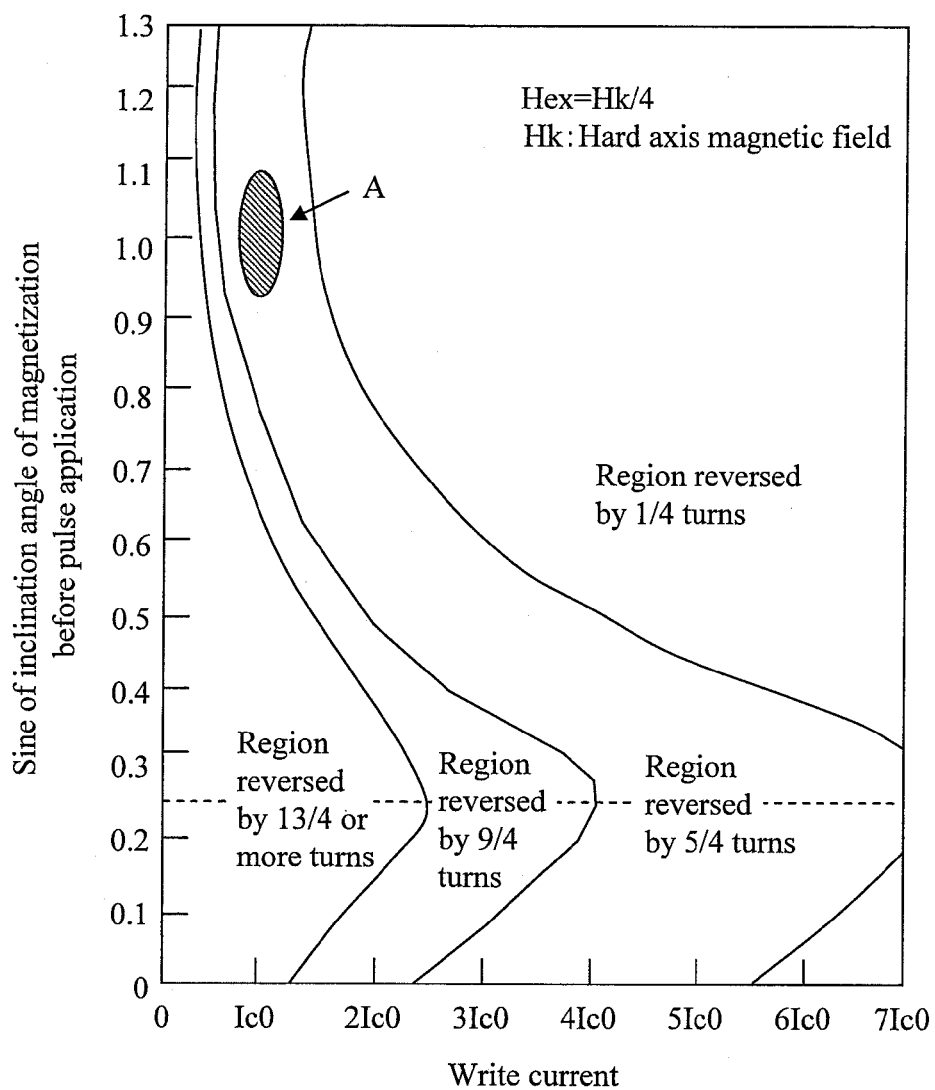
FIG. 8 is a diagram in which the number of rotations of the magnetization required for completing the magnetization reversal is plotted as a function of a current value and the sine of an angle θ (sin θ) of the magnetization of a recording layer at time zero to an easy magnetization axis in the present invention.

Next, description is given of how a temporal waveform of current pulse is determined. FIG. 8 is a diagram in which the number of rotations of the magnetization required for completing the magnetization reversal is plotted as a function of a current value and the sine of an angle $\theta$ ($\sin\theta$) of the magnetization of the recording layer at time zero to the easy magnetization axis, in the case where a leakage magnetic field H from the magnetization rotation assist layer has a magnitude which is ¼ of that of a magnetic field Hk required for redirecting the magnetization of the recording layer from the easy magnetization axis direction to the hard magnetization axis direction (such a magnetic field is called an anisotropic magnetic field). In this case, given the current value is $I_{c0}$ for example, it shows that the magnetization reversal is completed in 5/4 rotation without exception as shown in FIGS. 5 and 6, even if the angle of the magnetization of the recording layer relative to the easy magnetization axis fluctuates in a range A shown in FIG. 8 due to heat disturbance. In this way, the number of precession rotations required for the magnetization reversal can be determined uniquely by the leakage magnetic field H from the magnetization rotation assist layer and the current value to be applied. According to this, a pulse waveform can be determined. In other words, given the number of precession rotations of the magnetization of the recording layer typically required for the completion of the magnetization reversal is ¼+n (where n is an integer of 1 or larger), a current waveform can be set as follows with respect to time t.

$$I = I_0 \quad (O \le t \le T/4) \qquad (3)$$

$$O \quad (T/4 < t \le 3T/4)$$

$$I_0 \quad (3T/4 < t \le T5/4)$$

$$\ldots$$

$$O \quad (T/4 + (n-1)T < t \le 3T/4 + (n-1)T)$$

$$I_0 \quad (3T/4 + (n-1)T < t \le T5/4 + (n-1)T)$$

where $I_0$ denotes a value representing a flowing current which is determined on the basis of FIG. 8 and does not cross over multiple regions, as well as T denotes time required for one rotation of the precession. According to the formula (3), it is stated that the current should be switched on/off in a pulsed fashion. However, an actual waveform does not necessarily take the form of a pulse as shown in FIGS. 5 and 6 due to the waveform rounding caused depending on the capacitance of a circuit. In general, n is 0 or 1 in most cases, and thus the required current $I_0$ may be made as small as approximately $I_{c0}$. Accordingly, the present invention can control the process of spin torque magnetization reversal extremely precisely by setting a current pulse waveform suitable for the structure or material of a given magnetoresistive effect element.

Figure 1:
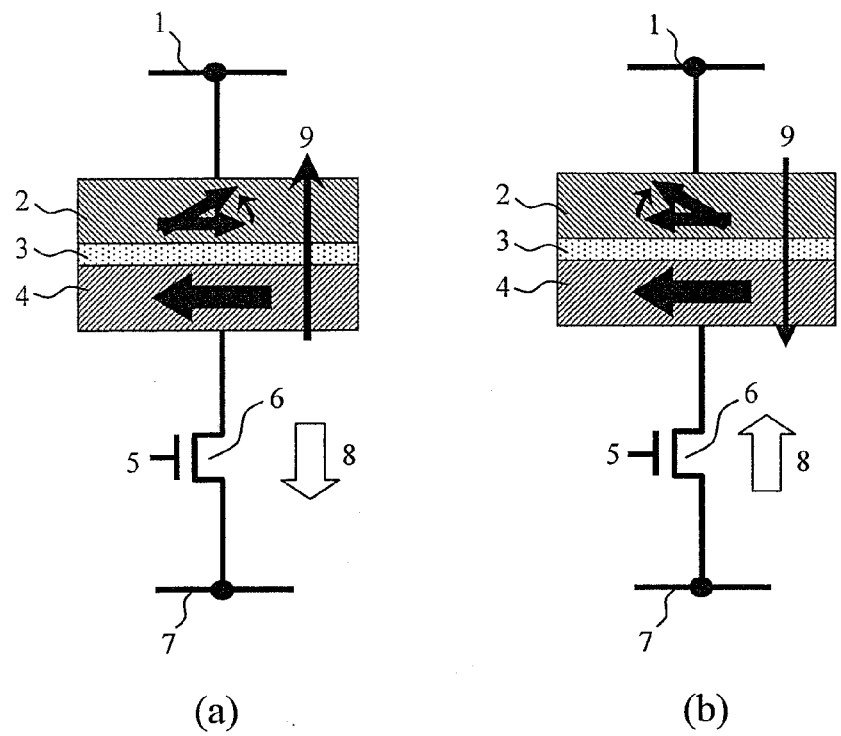
FIG. 1 is diagrams illustrating the principle of spin torque magnetization reversal, in which: part (a) is a diagram illustrating the magnetization reversal from an antiparallel state to a parallel state; and part (b) is a diagram illustrating the magnetization reversal from the parallel state to the antiparallel state.
Figure 2:
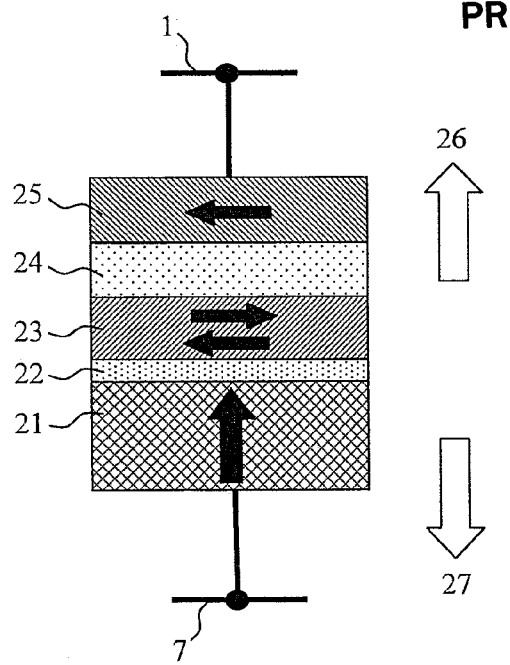
FIG. 2 is a diagram explaining a publicly known example.
Figure 3:
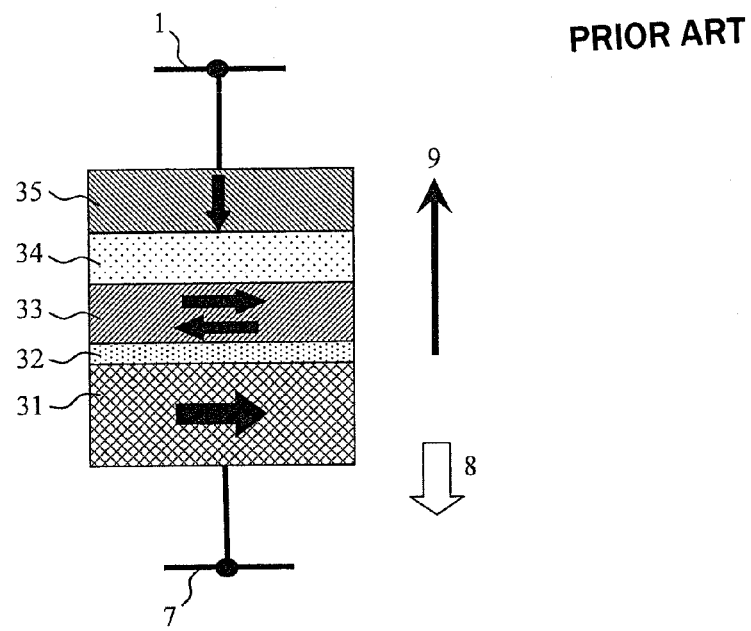
FIG. 3 is a diagram explaining another publicly known example.
Figure 9:
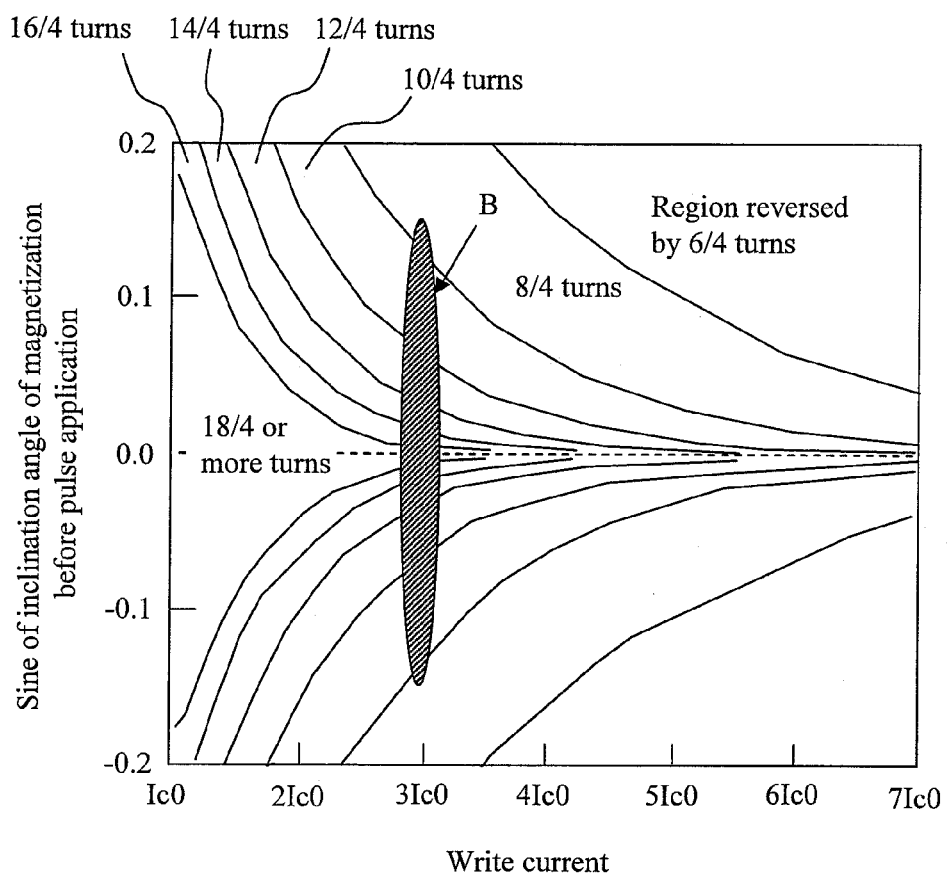
FIG. 9 is a diagram in which the number of rotations of the magnetization required for completing the magnetization reversal is plotted as a function of the current value and the sine of the angle θ (sin θ) of the magnetization of the recording layer at time zero to the easy magnetization axis in a conventional example.

FIG. 9 is a diagram in which the number of rotations of the magnetization required for completing the magnetization reversal in the case of the spin torque magnetization reversal of FIG. 1 (conventional example) is plotted as a function of a current value and the sine of an angle $\theta$ ($\sin\theta$) of the magnetization of the recording layer at time zero to the easy magnetization axis. For example, given the write current is $3I_{c0}$, the angle of the magnetization of the recording layer to the easy magnetization axis fluctuates to such an extent that is indicated as a range B of FIG. 9. Thus, the number of rotations required for completing the spin torque magnetization reversal is distributed in a wide range of 8/4 rotation to 18/4 rotation, and the time required for the magnetization reversal accordingly fluctuates along with this distribution. The comparison of FIG. 8 and FIG. 9 shows that this example can make the current required for the magnetization reversal extremely smaller, and control the time required for the spin torque magnetization reversal with extremely higher precision.

With the above description, it is understood that the present invention has an effect of fundamentally solving the problem with the reversal probability distribution, beyond the above-mentioned general effect of reducing the switching probability distribution by the application of the hard axis magnetic field, by perfectly controlling the reversal probability in the spin torque magnetization reversal.

Next, description is given of an example of the film structure of a magnetic memory cell and an example of the configuration of a magnetic memory cell array, according to the present invention.

(1) Example of Film Structure of Magnetic Memory Cell

Hereinbelow, the specific structure of a magnetic memory cell is described.

First Film Configuration Example

In FIG. 4, Ta is used as the underlying film 41, MnIr is used as the antiferromagnetic film 42, CoFeB is used as the fixed layer 43, MgO is used as the insulating barrier layer 44, CoFeB is used as the recording layer 45, MgO is used as the nonmagnetic intermediate layer 46, CoFeB is used as the magnetization reversal assist layer 47, PtMn is used as the antiferromagnetic layer 48, and Ta is used as the cap layer 49. This is a basic configuration, and is a configuration which can achieve all the effects mentioned above.

Second Film Configuration Example

In FIG. 4, Ta is used as the underlying film 41, MnIr is used as the antiferromagnetic film 42, a CoFe/Ru/CoFeB synthetic ferrimagnetic structure (structure in which CoFe and CoFeB are nonexchange-coupled to each other with an Ru film in between) is used as the fixed layer 43, MgO is used as the insulating barrier layer 44, CoFeB is used as the recording layer 45, MgO is used as the nonmagnetic intermediate layer 46, CoFeB is used as the magnetization reversal assist layer 47, PtMn is used as the antiferromagnetic layer 48, and Ta is used as the cap layer 49. With this configuration, since the fixed layer has magnetizations directed in their respective opposite directions due to antiparallel coupling, a leakage magnetic flux from the fixed layer 43 never reaches the recording layer 45. This can reduce an offset of the magnetic field-resistance hysteresis, which determines the performance of the recording layer 45, from the magnetic field (which means that the center of the hysteresis shifts from the zero magnetic field).

Third Film Configuration Example

In FIG. 4, Ta is used as the underlying film 41, MnIr is used as the antiferromagnetic film 42, the CoFe/Ru/CoFeB synthetic ferrimagnetic structure is used as the fixed layer 43, MgO is used as the insulating barrier layer 44, a CoFe/Ru/CoFeB synthetic ferrimagnetic structure is used as the recording layer 45, MgO is used as the nonmagnetic intermediate layer 46, CoFeB is used as the magnetization reversal assist layer 47, PtMn is used as the antiferromagnetic layer 48, and Ta is used as the cap layer 49. With this configuration, the fixed layer 43 has magnetizations which are directed in their respective opposite direction due to antiparallel coupling, a leakage magnetic flux from the fixed layer 43 never reaches the recording layer 45. In addition, a leakage magnetic field of the recording layer itself is closed in the two magnetic films forming the recording layer. This configuration thereby can reduce the offset of the magnetic field-resistance hysteresis of the recording layer from the magnetic field to substantially zero. The configuration also can increase the coercive force of the recording layer by increasing the volume of the entire recording layer and approximating the thicknesses of the two magnetic films forming the recording layer, thus providing a thermally-stable magnetic memory cell.

Fourth Film Configuration Example

In FIG. 4, Ta is used as the underlying film 41, MnIr is used as the antiferromagnetic film 42, the CoFe/Ru/CoFeB synthetic ferrimagnetic structure is used as the fixed layer 43, MgO is used as the insulating barrier layer 44, a CoFe/Ru/CoFeB synthetic ferrimagnetic structure is used as the recording layer 45, Cu is used as the nonmagnetic intermediate layer 46, CoFe is used as the magnetization reversal assist layer 47, PtMn is used as the antiferromagnetic layer 48, and Ta is used as the cap layer 49. This configuration uses metal of Cu as the intermediate layer 46, and thus can reduce the resistance of the entire element, as compared to the third film configuration described above.

In the above configurations, even the use of antiferromagnetic materials other than MnIr and PtMn as the antiferromagnetic films 42 and 48 does not change the basic effects of the present invention. Moreover, even the use of a CoFe-based material as a material of the fixed layer 43 does not change the basic effects of the present invention. Additionally, if a Heusler alloy such as $Co_2MnSi$ is used as a material of the fixed layer 43 to further increase the polarization ratio p, this has an effect of further reducing $I_{c0}$. Even the use of Al oxide, Ti oxide, or a nitride material such as TiN or AlN as a material of the barrier layer 44 does not change the basic effects of the present invention.

(2) Example of Configuration of Magnetic Random Access Memory

Figure 10:
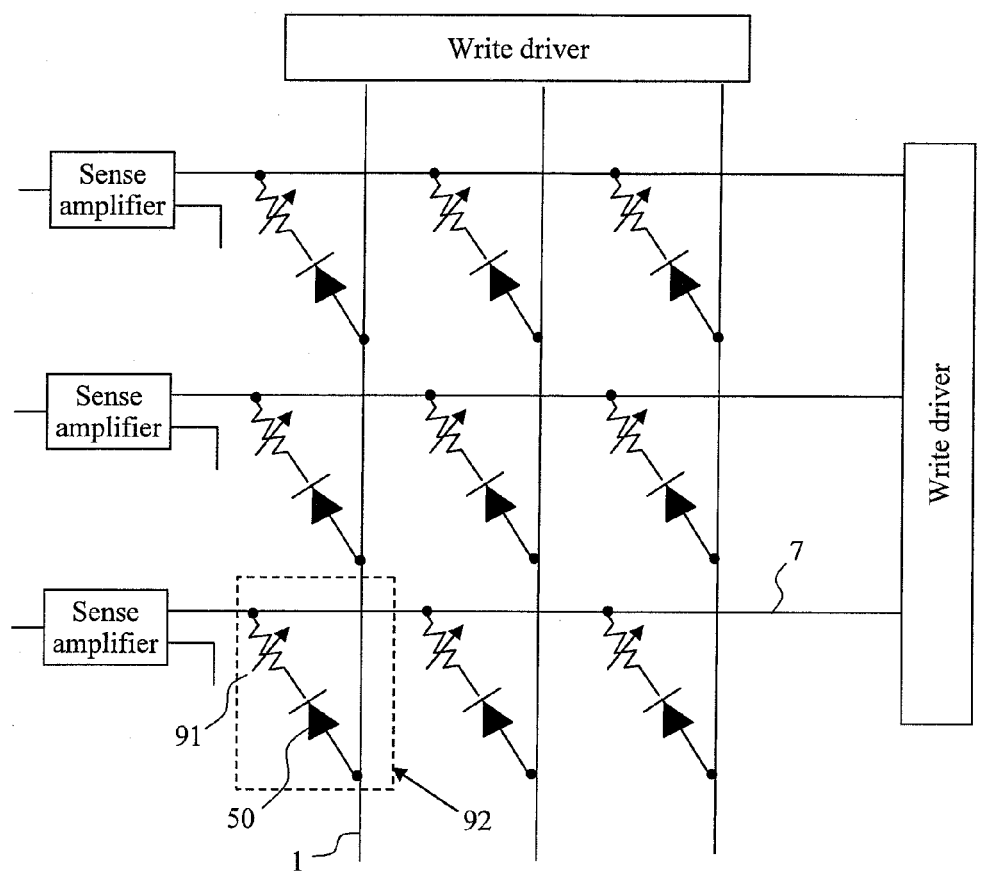
FIG. 10 is a diagram illustrating an example of the configuration of a magnetic random access memory using a diode.

(2-1) Example of Configuration of Magnetic Random Access Memory Using Diode FIG. 10 illustrates an example of the configuration of a magnetic random access memory according to the present invention. In FIG. 10, reference numeral 1 denotes a source line; reference numeral 50 denotes a diode; reference numeral 91 denotes a magnetoresistive effect element of the present invention; reference numeral 7 denotes a bit line; and reference numeral 92 denotes one magnetic memory cell. The source line 1 and the bit line 7 are driven by different write driver circuits. A sense amplifier which amplifies a read signal from a magnetic memory cell is connected to the bit line 7. In the illustrated example, the diode 50 is connected to the magnetoresistive effect element 91 so as to pass a current in a direction from the fixed layer to the recording layer. One end of the diode is electrically connected to the source line, and the magnetic rotation assist layer of the magnetoresistive effect element 91 is connected to the bit line.

At the time of write, the source line write driver increases the voltage of only one source line 1 to a write voltage V, and sets the other source lines to the ground level. The bit line write driver sets only one bit line 7 to the ground level, and maintains the voltage of the other lines at the voltage V. Thereby, a current flows only through the selected memory cell 92, and the write is thus performed only on the selected magnetoresistive effect element 91. At the time of read, a current is caused to flow only through the memory cell 91 by the same procedure, while erroneous write is prevented by setting the flowing current to a value sufficiently smaller than $I_{c0}$. Since this structure employs the simplest cross-point arrangement, the structure can make a memory highly-integrated with the area occupied by each unit cell as small as 2 F×2 F=4 $F^2$.

Figure 11:
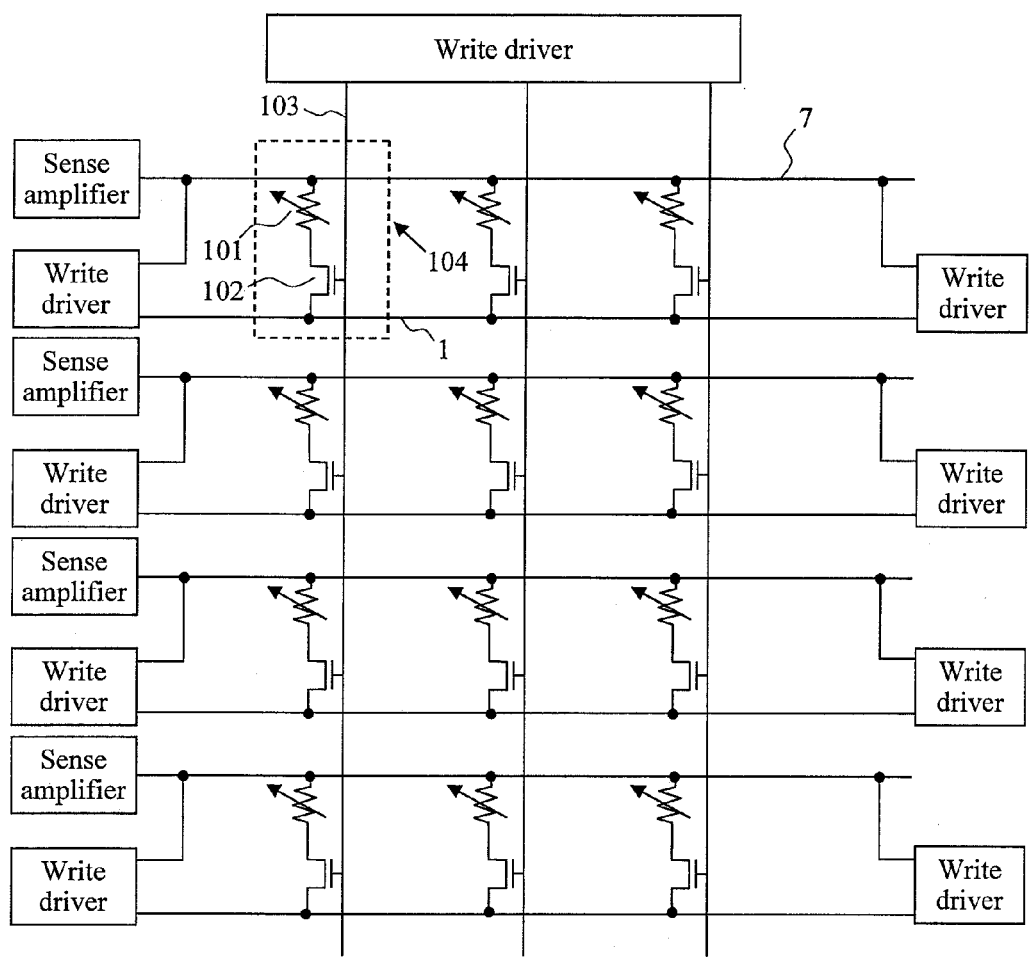
FIG. 11 is a diagram illustrating an example of the configuration of a magnetic random access memory using a transistor.

(2-2) Example of Configuration of Magnetic Random Access Memory Using Transistor FIG. 11 illustrates another example of the configuration of a magnetic random access memory according to the present invention. In FIG. 11, reference numeral 1 denotes a source line; reference numeral 101 denotes a magnetoresistive effect element of the present invention; reference numeral 7 denotes a bit line; reference numeral 102 denotes a cell selection transistor; reference numeral 103 denotes a word line; and reference numeral 104 denotes one magnetic memory cell. A sense amplifier which amplifies a read signal from a magnetic memory cell is connected to the bit line 7. In the illustrated example, one end of the transistor 102 is electrically connected to the source line 1, the magnetization rotation assist layer of the magnetoresistive effect element 101 is connected to the bit line 7, and the transistor 102 is controlled by the word line 103.

The write with this configuration is performed in the following way. The voltage of only one source line 1 connected to the memory cell of the write target is increased to a write voltage V by a write driver, and another write driver selects only a word line connected to the cell selection transistor 102 of the target memory cell. Thereby, the transistor 102 is turned ON to cause a current to flow.

The read is performed in the following way. In contrast to the above, the voltage of only a bit line 7 connected to the memory cell of the read target is increased to a read voltage V, and another write driver selects only a word line connected to the selection transistor 102. Thereby, the transistor 102 is turned ON to cause a current to flow. In this case, since the current direction at the time of read is opposite to the current direction at the time of write, there is no risk of erroneous write due to the read current. This enables a larger read current to flow, thus enabling high speed readout. Since this structure employs the simplest arrangement of 1 transistor+1 memory cell, the structure can make a memory highly-integrated with the area occupied by each unit cell as small as 2 F×4 F=8 F².

DESCRIPTION OF SYMBOLS

| | |
|---|---|
| 1 | bit line |
| 2 | ferromagnetic layer (recording layer) |
| 3 | intermediate layer |
| 4 | ferromagnetic layer (fixed layer) |
| 5 | gate electrode |
| 6 | transistor |
| 7 | source line |
| 8 | current direction |
| 9 | electron moving direction |
| 21 | ferromagnetic fixed layer having a magnetization direction perpendicular to the magnetic film |
| 22 | nonmagnetic intermediate layer |
| 23 | ferromagnetic layer (recording layer) |
| 24 | nonmagnetic intermediate layer |
| 25 | reference layer |
| 26, 27 | current direction |
| 31 | fixed layer |
| 32 | nonmagnetic layer |
| 33 | recording layer |
| 34 | nonmagnetic layer |
| 35 | spin torque driving layer |
| 41 | underlying film |
| 42 | antiferromagnetic film |
| 43 | fixed layer |
| 44 | insulating barrier layer |
| 45 | recording layer |
| 46 | intermediate layer |
| 47 | magnetization reversal assist layer |
| 48 | antiferromagnetic layer |
| 49 | cap layer |
| 50 | diode |
| 71 | leakage magnetic flux |
| 91 | magnetoresistive effect element |
| 92 | memory cell |
| 101 | memory cell |
| 102 | transistor |
| 103 | word line |
| 104 | memory cell |

The invention claimed is:

1. A magnetic memory cell comprising:
a magnetoresistive effect element in which a fixed layer comprised of a ferromagnetic material, a nonmagnetic layer, a recording layer comprised of a ferromagnetic material, a nonmagnetic layer, and a magnetization rotation assist layer comprised of a ferromagnetic material are stacked one on top of another, characterized in that:
magnetizations of the fixed layer, the recording layer, and the magnetization rotation assist layer are all oriented in in-plane directions thereof,
the magnetization direction of the magnetization rotation assist layer is substantially orthogonal to the magnetization direction of the fixed layer, and
information is recorded by making the magnetization direction of the recording layer substantially parallel or substantially antiparallel to the magnetization direction of the fixed layer,
characterized in that a diode is connected to the magnetoresistive effect element, the diode being capable of passing a current in a direction from the fixed layer to the recording layer,
characterized in that the current is caused to flow in the direction from the fixed layer to the recording layer in both cases where the magnetization direction of the recording layer is rewritten from a direction parallel to the magnetization direction of the fixed layer to a direction antiparallel thereto and where the magnetization direction of the recording layer is rewritten from the antiparallel direction to the parallel direction, and
characterized in that, given T denotes a cycle of a precession of the magnetization of the recording layer, the current for the rewrite is caused to flow from start of rewrite till T/4, and is thereafter reduced to zero.

2. The magnetic memory cell according to claim 1, characterized in that an antiferromagnetic layer is provided in contact with a surface of the fixed layer which is opposite from the recording layer.

3. The magnetic memory cell according to claim 1, characterized in that an antiferromagnetic layer is provided in contact with a surface of the magnetization rotation assist layer which is opposite from the recording layer.

4. The magnetic memory cell according to claim 1, characterized in that the current for the rewrite is thereafter caused to flow from 3T/4 to 5T/4.

5. A magnetic memory cell comprising:
a magnetoresistive effect element in which a fixed layer comprised of a ferromagnetic material, a nonmagnetic layer, a recording layer comprised of a ferromagnetic material, a nonmagnetic layer, and a magnetization rotation assist layer comprised of a ferromagnetic material are stacked one on top of another, characterized in that:

magnetizations of the fixed layer, the recording layer, and the magnetization rotation assist layer are all oriented in in-plane directions thereof, the magnetization direction of the magnetization rotation assist layer is substantially orthogonal to the magnetization direction of the fixed layer, and characterized in that the magnetic memory cell further includes a transistor for passing a current through the magnetoresistive effect element, characterized in that the current is caused to flow in the direction from the fixed layer to the recording layer in both cases where the magnetization direction of the recording layer is rewritten from a direction parallel to the magnetization direction of the fixed layer to a direction antiparallel thereto and where the magnetization direction of the recording layer is rewritten from the antiparallel direction to the parallel direction, a read current is caused to flow in a direction from the recording layer to the fixed layer at a time of reading information from the magnetic memory, and characterized in that, given T denotes a cycle of a precession of the magnetization of the recording layer, the current for the rewrite is caused to flow from start of rewrite till T/4, and is thereafter reduced to zero.

6. The magnetic memory cell according to claim 5, characterized in that the current for the rewrite is thereafter caused to flow from 3T/4 to 5T/4.

7. A magnetic random access memory characterized by comprising:

a first driver circuit to which a plurality of source lines are connected;

a second driver circuit to which a plurality of bit lines are connected;

a plurality of magnetic memory cells respectively arranged in cross regions of the source lines and the bit lines; and a plurality of amplifiers, respectively connected to the plurality of bit lines, for amplifying read signals from the magnetic memory cells, characterized in that each of the magnetic memory cells includes a magnetoresistive effect element in which a fixed layer comprised of a ferromagnetic material, a nonmagnetic layer, a recording layer comprised of a ferromagnetic material, a nonmagnetic layer, and a magnetization rotation assist layer comprised of a ferromagnetic material are stacked one on top of another, and a diode, one end of which is connected to the magnetoresistive effect element, magnetizations of the fixed layer, the recording layer, and the magnetization rotation assist layer are all oriented in in-plane directions thereof, the magnetization direction of the magnetization rotation assist layer is substantially orthogonal to the magnetization direction of the fixed layer, information is recorded by making the magnetization direction of the recording layer substantially parallel or substantially antiparallel to the magnetization direction of the fixed layer, another end of the diode is connected to the corresponding source line in such a way that the diode passes a current through the magnetoresistive effect element in a direction from the fixed layer to the recording layer, and the magnetization rotation assist layer of the magnetoresistive effect element is connected to the corresponding bit line, characterized in that the current is caused to flow in the direction from the fixed layer to the recording layer in both cases where the magnetization direction of the recording layer is rewritten from a direction parallel to the magnetization direction of the fixed layer to a direction antiparallel thereto and where the magnetization direction of the recording layer is rewritten from the antiparallel direction to the parallel direction, and characterized in that, given T denotes a cycle of a precession of the magnetization of the recording layer, the current for the rewrite is caused to flow from start of rewrite till T/4, and is thereafter reduced to zero.

8. A magnetic random access memory characterized by comprising:

a first driver circuit to which a plurality of source lines are connected;

a second driver circuit to which a plurality of bit lines are connected;

a third driver circuit to a plurality of word lines are connected;

a plurality of magnetic memory cells respectively arranged in cross regions of the source lines, the bit lines and the word lines; and a plurality of amplifiers, respectively connected to the plurality of bit lines, for amplifying read signals from the magnetic memory cells, characterized in that each of the magnetic memory cells includes a magnetoresistive effect element in which a fixed layer comprised of a ferromagnetic material, a nonmagnetic layer, a recording layer comprised of a ferromagnetic material, a nonmagnetic layer, and a magnetization rotation assist layer comprised of a ferromagnetic material are stacked one on top of another, and a transistor, one end of which is connected to the magnetoresistive effect element, magnetizations of the fixed layer, the recording layer, and the magnetization rotation assist layer are all oriented in in-plane directions thereof, the magnetization direction of the magnetization rotation assist layer is substantially orthogonal to the magnetization direction of the fixed layer, information is recorded by making the magnetization direction of the recording layer substantially parallel or substantially antiparallel to the magnetization direction of the fixed layer, another end of the transistor is connected to the corresponding source line, the magnetization rotation assist layer is connected to the corresponding bit line, resistance of the transistor is controlled by the corresponding word line, at the time of writing information, a voltage of the source line connected to the magnetic memory cell on which write is to be performed is increased to a write voltage by the first driver circuit, and the third driver circuit controls the transistor of the memory cell so that the current flows, and at the time of reading information, a voltage of the bit line connected to the magnetic memory cell on which read is to be performed is increased to a read voltage by the second driver circuit, and the third driver circuit controls the transistor of the memory cell so that the current flows, characterized in that the current is caused to flow in a direction from the fixed layer to the recording layer in both cases where the magnetization direction of the recording layer is rewritten from a direction parallel to the magnetization direction of the fixed layer to a direction antiparallel thereto and where the magnetization direction of the recording layer is rewritten from the antiparallel direction to the parallel direction, a read current is caused to flow in a direction from the recording layer to the fixed layer at a time of reading information from the magnetic memory, and characterized in that, given T denotes a cycle of a precession of the magnetization of the recording layer, the current for the rewrite is caused to flow from start of rewrite till T/4, and is thereafter reduced to zero.

* * * * *